United States Patent
Wu

(10) Patent No.: US 8,236,605 B2
(45) Date of Patent: Aug. 7, 2012

(54) METHOD FOR SEPARATING SEMICONDUCTOR WAFER INTO CHIPS

(75) Inventor: Ming-Ching Wu, Taipei County (TW)

(73) Assignee: Domintech Co., Ltd., Taipei County (TW)

( * ) Notice: Subject to any disclaimer, the term of this patent is extended or adjusted under 35 U.S.C. 154(b) by 203 days.

(21) Appl. No.: 12/838,939

(22) Filed: Jul. 19, 2010

(65) Prior Publication Data

US 2011/0269296 A1 Nov. 3, 2011

(30) Foreign Application Priority Data

Apr. 30, 2010 (TW) ................................ 99113872 A

(51) Int. Cl.
*H01L 21/00* (2006.01)
(52) U.S. Cl. ............ 438/106; 438/23; 438/26; 438/100; 257/620
(58) Field of Classification Search .................. 438/23, 438/26, 100, 106; 257/620; 156/60
See application file for complete search history.

(56) References Cited

U.S. PATENT DOCUMENTS

| 7,995,880 B2 * | 8/2011 | Kodama et al. ................. 385/14 |
| 8,053,269 B2 * | 11/2011 | Tanaka ............................ 438/69 |
| 8,120,040 B2 * | 2/2012 | Asai et al. ....................... 257/74 |
| 2010/0308318 A1 * | 12/2010 | Kawase et al. .................. 257/40 |
| 2012/0045894 A1 * | 2/2012 | Yamazaki et al. ............ 438/652 |
| 2012/0056289 A1 * | 3/2012 | Tian et al. ...................... 257/431 |
| 2012/0070919 A1 * | 3/2012 | Takayama et al. .............. 438/22 |

* cited by examiner

*Primary Examiner* — Thanh V Pham
(74) *Attorney, Agent, or Firm* — Browdy and Neimark, PLLC

(57) ABSTRACT

A method for separating a semiconductor wafer into chips includes the steps of sandwiching a soluble spacer between a wafer and a substrate to form a laminate, etching the wafer into a plurality of chips attached on the spacer, positioning the laminate in a chamber of an apparatus in a way that the etched wafer faces a stage of the apparatus, and introducing a solvent into the chamber to dissolve the soluble spacer so as to facilitate the chips to be supported on the stage.

5 Claims, 3 Drawing Sheets

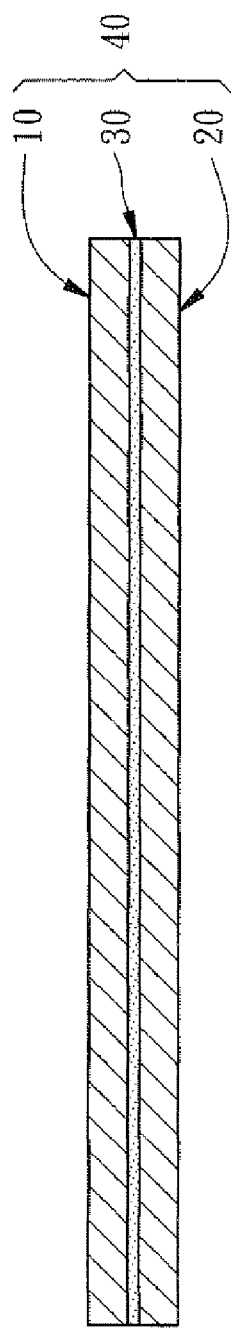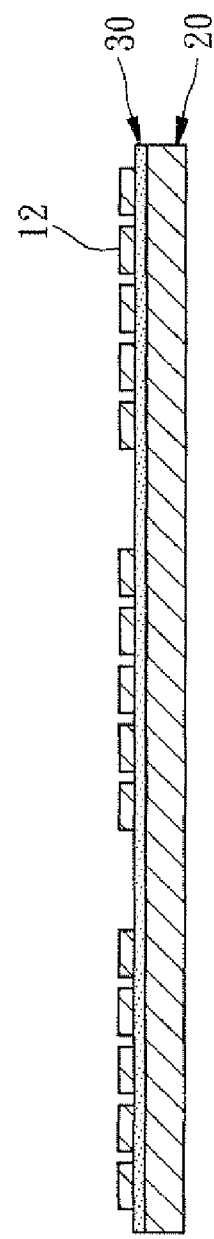

METHOD FOR SEPARATING SEMICONDUCTOR WAFER INTO CHIPS

BACKGROUND OF THE INVENTION

1. Field of the Invention

The present invention relates generally to a method for separating chips from a semiconductor wafer and more particularly, to a non-physical cutting method for separating a semiconductor wafer into individual chips.

2. Description of the Related Art

The conventional methods for separating a semiconductor wafer into chips extensively used nowadays are primarily physical cutting methods. Specifically speaking, the so-called "physical cutting methods" include, but not limited to, the sawing method of using a diamond saw blade and a laser cutting method. These methods can be seen in U.S. Pat. Nos. 6,121,118, 6,924,210 and 7,550,367. However, there are in fact more or less disadvantages in these physical cutting methods. For example, the cutting edge of the chips tends to be damaged in the sawing process and the chips may be contaminated by the cutting debris or powders. On the other hand, the separated cut chips may be contaminated by the ashes caused by the high-temperature laser cutting. In addition, the cutting rate of the aforesaid two methods is unsatisfied.

SUMMARY OF THE INVENTION

The present invention has been accomplished in view of the above-noted circumstances. It is an objective of the present invention to provide a method for separating a semiconductor wafer into chips, which can prevent the disadvantages of the above-mentioned physical cutting method.

To attain the above objective, the present invention provides a method for separating a semiconductor wafer into chips comprises the following steps. A wafer and a substrate are first prepared and provided, and then a soluble spacer is sandwiched between the wafer and the substrate to form a laminate. Thereafter, the wafer is etched into a plurality of chips, which are attached on the spacer after etching. An apparatus having a chamber and a stage is then provided, and the laminate is positioned in the chamber of the apparatus in such a way that the etched wafer faces the stage. Finally, a solvent is introduced into the chamber to dissolve the soluble spacer so as to facilitate the chips to be supported on the stage. By means of the method provided by the present invention, neither cutting burrs and debris nor ashes will be generated, and the chips are simultaneously separated from the wafer, thereby resolve the disadvantages of the physical cutting methods mentioned above.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWING

The present invention will become more fully understood from the detailed description given herein below and the accompanying drawings which are given by way of illustration only, and thus are not limitative of the present invention, and wherein:

FIG. 1 is a schematic drawing showing a step of the method provided by a preferred embodiment of the present invention, wherein a soluble spacer is sandwiched between a semiconductor wafer and a substrate to form a laminate;

FIG. 2 is a schematic drawing showing an etching step of the method of the present invention, wherein the wafer is etched into individual chips attached on the spacer;

DETAILED DESCRIPTION OF THE INVENTION

Figure 3:
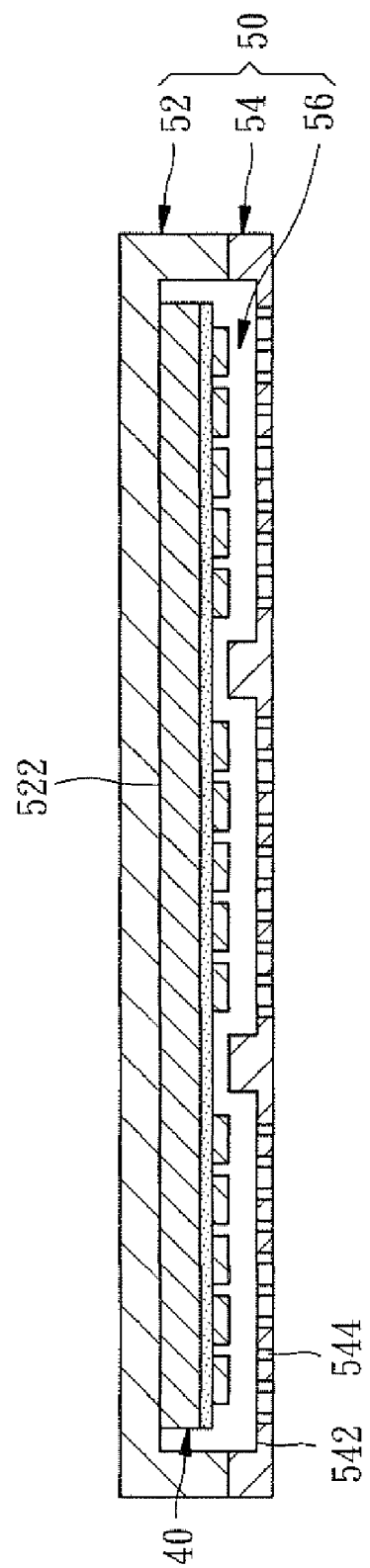
FIG. 3 is a schematic drawing showing that the laminate is positioned in a chamber of a jig in a way that the etched wafer faces downward.

The method for separating a semiconductor wafer into chips of the present invention can be realized by the following steps. However, it will be appreciated that these steps are an embodiment of the present invention.

Firstly, a semiconductor wafer 10 that is to be separated into chips and a substrate 20 for supporting the wafer 10 are prepared and provided. For the substrate 20, a wafer having a same size with that of the to-be-separated wafer 10 can be used in this embodiment. Thereafter, a soluble spacer 30 is sandwiched between the wafer 10 and the substrate 20, such that a laminate 40 is formed having a sandwich configuration, as shown in FIG. 1. It is to be noted that any material that can be dissolved by a predetermined solvent can be used to make the space 30. Preferably, the spacer 30 can be made of polymer.

Subsequently, the wafer 10 is separated into a plurality of chips 12 by etching. Since the way of etching is a well-known prior art, no detailed description thereof will be necessarily recited hereinafter. After etching, the individual chips are still attached on the spacer 30, as shown in FIG. 2.

And then, an apparatus, such as a jig 50 shown in FIG. 3, is provided. The jig 50 has a cap 52 and a base 54 covered by the cap 52, such that a chamber 56 is defined between the cap 52 and the base 54. The base 54 has a stage 542 with a plurality of holes 544 therethrough. In addition, the sandwich laminate 40 is mounted on a top inner surface 522 of the cap 52 in such a way the etched wafer 10, i.e. the individual chips 12, faces downward. In other word, the etched wafer 10 faces the stage 542 of the base 54 when the laminate 40 is positioned in the chamber 56 of the jig 50.

Figure 4:
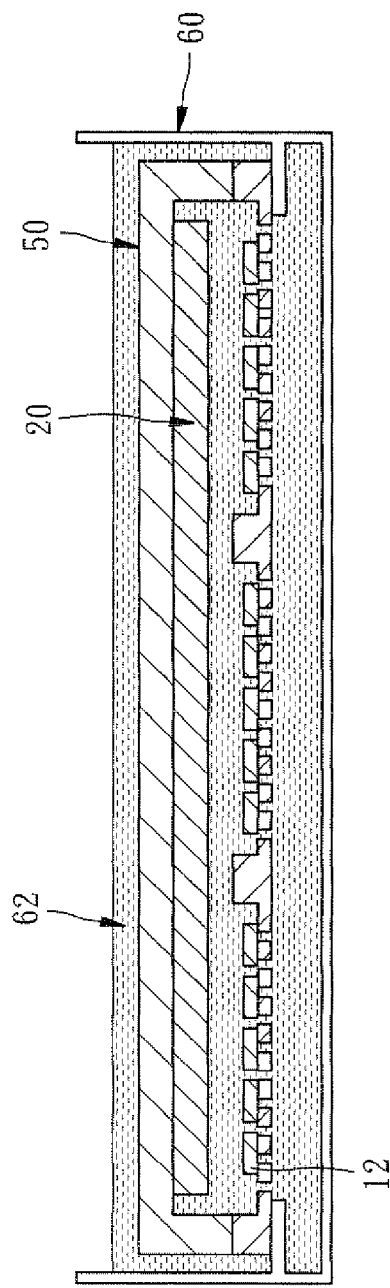
FIG. 4 is a schematic drawing showing that the jig holing the laminate is immerged into a solvent contained in a tank for dissolution of the soluble spacer.

Thereafter, as shown in FIG. 4, the jig 50 holding the laminate 40 is immerged into a chemical solvent 62 contained in a tank 60. For the solvent, it is not limited to any specific solvent. However, a liquid solvent that can dissolve the spacer 30 but can not dissolve the wafer 10 and the substrate 20 should be used. Since there are kinds of solvent can be used depending on the material of the space 30 and these solvents are well-known, no more detailed description of the kinds of solvent needs to be recited hereinafter. In the process of immerging the jig 50 into the solvent 62, the solvent 62 will flow into the chamber 56 of the jig 50 through the through holes 544 of the stage 542 to dissolve the spacer 30. After the spacer 30 is completely dissolved, the separated chips 12 will be supported on the stage 542 of the base 54.

Finally, the jig 50 is taken out from the tank 60 to enable the solvent in the chamber 56 to be discharged out of the chamber 56 of the jig 50 through the through holes 544 of the stage 542.

Figure 5:
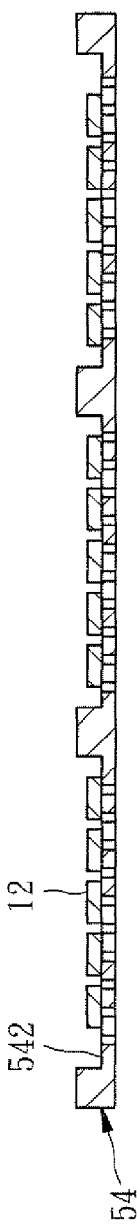
FIG. 5 is a schematic drawing showing that the separated chips are supported on the stage of the jig.

After the cap 52 is opened, as shown in FIG. 5, the separated chips 12 can be taken out from the base 54 of the jig 50 for further processing.

As indicated above, the method provided by the present invention does not require sawing or laser cutting to process the wafer, thereby preventing the disadvantages of the aforesaid two prior art methods.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for separating a semiconductor wafer into chips comprising the steps of:
   a) preparing a wafer and a substrate;
   b) sandwiching a soluble spacer between the wafer and the substrate to form a laminate;
   c) etching the wafer into a plurality of chips attached on the spacer;
   d) providing an apparatus having a chamber and a stage;
   e) positioning the laminate in the chamber of the apparatus in such a way that the etched wafer faces the stage; and
   f) introducing a solvent into the chamber to dissolve the soluble spacer so as to facilitate the chips to be supported on the stage.

2. The method as claimed in claim 1, wherein the spacer is made of polymer.

3. The method as claimed in claim 1, wherein the apparatus comprises a jig having a base provided with the stage, and a cap covering the base and defining with the base the chamber; the laminate is mounted on a top inner surface of the cap, such that the etched wafer faces the stage.

4. The method as claimed in claim 3, wherein the base of the jig has a plurality of through holes for the solvent to enter and exit the chamber.

5. The method as claimed in claim 4, wherein the step f) is carried out by immerging the jig into the solvent contained in a tank.

* * * * *